US006914386B2

United States Patent
Pearl

(10) Patent No.: US 6,914,386 B2
(45) Date of Patent: Jul. 5, 2005

(54) SOURCE OF LIQUID METAL IONS AND A METHOD FOR CONTROLLING THE SOURCE

(75) Inventor: Asher Pearl, Kadima (IL)

(73) Assignee: Applied Materials Israel, Ltd., Rehovot (IL)

(*) Notice: Subject to any disclaimer, the term of this patent is extended or adjusted under 35 U.S.C. 154(b) by 74 days.

(21) Appl. No.: 10/667,875

(22) Filed: Sep. 22, 2003

(65) Prior Publication Data

US 2005/0062480 A1 Mar. 24, 2005

Related U.S. Application Data

(60) Provisional application No. 60/480,002, filed on Jun. 20, 2003.

(51) Int. Cl.[7] .......................... H01J 27/22; H01J 37/08; H01J 49/10
(52) U.S. Cl. ............... 315/111.81; 313/230; 313/362.1; 313/363.1; 250/423 R; 250/424; 250/425
(58) Field of Search ...................... 315/111.81; 313/230, 313/362.1, 363.1; 250/423 R, 424, 425

(56) References Cited

U.S. PATENT DOCUMENTS

| 4,617,203 A | * | 10/1986 | Jergenson .................... 427/294 |
| 4,670,685 A | * | 6/1987 | Clark et al. .................. 313/230 |
| 4,994,711 A | * | 2/1991 | Matossian ................. 313/362.1 |

* cited by examiner

*Primary Examiner*—Nikita Wells
(74) *Attorney, Agent, or Firm*—Blakely, Sokoloff, Taylor & Zafman

(57) ABSTRACT

The invention provides a system and method for controlling a source of liquid metal ions, the source comprises a tip a first electrode and a second electrode, the method includes the steps of: (i) maintaining the first electrode at a first voltage level range and maintaining the second voltage at a second voltage range, such as to extract metal ions formed on a tip of the source, during an active mode of operation of the source; and (ii) maintaining the first electrode at a third voltage level range and maintaining the second voltage at a fourth voltage level range, such as to substantially reduce an extraction of metal ions from the tip, during an idle mode of operation of the source. The third voltage level range and, alternatively or additionally, the fourth voltage level ranges does not include zero voltage level. The first voltage level range differs than the third voltage level range.

32 Claims, 3 Drawing Sheets

SOURCE OF LIQUID METAL IONS AND A METHOD FOR CONTROLLING THE SOURCE

The present application is a non-provisional application claiming the priority of U.S. Provisional Patent Application No. 60/480,002, filed Jun. 20, 2003.

FIELD OF THE INVENTION

The present invention relates to sources of liquid metal ions systems and methods for controlling these sources.

BACKGROUND OF THE INVENTION

Focused ion beam (FIB) systems are known in the art. FIB systems are generally utilized to perform die milling and cross sectioning. The milled or cross-sectioned object is usually analyzed by an inspection device, such as a Scanning Electron Microscope (SEM), to detect defects. FIB systems can also be utilized to generate FIB images.

Various configurations of ion sources as well as voltage supplies and electrodes are known in the art. Some of these configurations are described at U.S. Pat. No. 6,472,881 of Sugiyama et al., U.S. Pat. No. 6,459,082 of Sakaguchi, U.S. Pat. No. 5,153,440 of Yasaka and U.S. Pat. No. 5,111,053 of Suzuki. All said patents are incorporated herein by reference. U.S. Pat. No. 6,472,881 describes an liquid metal ion source and a method for measuring flow impedance of liquid metal ion source. U.S. Pat. No. 5,111,053 describes a method for controlling a liquid metal ion source by analog feedback and digital CPU control. U.S. Pat. No. 5,153,440 describes a method for stabilizing operation for a liquid metal ion source. U.S. Pat. No. 6,459,081 describes a focused ion beam system.

A FIB system that is operative to generate a FIB image also has at least one detector and an image processor. Usually, the ion source, the FIB lens system and the ion beam deflector are located within a column that is commonly referred to as FIB column. The detector can also be placed within the FIB column.

SEM images are generated by irradiating an object with an electron beam, collecting signals resulting from an interaction of the electron beam with at least one portion of the object and processing the collected signals. FIB images are generated in a similar analogues manner, except that the object is irradiated with a focused ion beam.

Though separate SEM and FIB tools are quite common, systems that include both FIB and SEM systems are also available. These hybrid systems are known as FIB/SEM systems. The SEM portion of the hybrid tool facilitates inspection of a surface of an inspected object, such as a surface of a multi- layered die. The FIB portion of the hybrid systems facilitates milling the surface and exposing inner layers to inspection. Usually, after the FIB mills the die, the SEM is utilized to inspect the revealed layers and to further analyze the milled die for detecting defects. Two prior art FIB/SEM systems are the XL860 DualBeam Workstation of FEI or the SEMVisionG2 of Applied Materials Inc. of Santa Clara.

The XL860 includes a FIB column and SEM column that are angularly displaced from each other while the SEMVisionG2 includes substantially parallel SEM and FIB columns.

Typically, the focused ion beam is used to mill an object at certain intervals that are spaced apart from each other. Usually, once a wafer is milled or even partially milled it is inspected by the SEM, or by another tool.

Each liquid metal ion source has a predetermined amount of ions to provide. Thus, once the amount is provided the liquid metal ion source has to be placed or refilled. The replacement is time consuming and also costly. In some cases a liquid metal ion source replacement or re-filling procedure requires to open the FIB chamber, which is a time consuming procedure during which the vacuum level of the chamber (or even more than one level) must be restored. This opening may also expose the FIB. column to contaminations.

There is a need to provide an efficient system and method for improved utilization of liquid metal ion sources.

SUMMARY OF THE INVENTION

The invention provides a system and method for reducing ion emission during idle periods.

The invention provides a system and method for substantially eliminating ion emission during idle periods, whereas the transmission between the idle mode and an active mode is fast.

According to an embodiment of the invention the ion optics characteristics are hardly influenced (or even are not influenced at all) by a transmission between an idle mode and an active mode.

According to an embodiment of the invention the one or more voltage being supplied to one or more corresponding electrode is not substantially changed during the transmission between the modes, while one or more voltage being supplied to one or more other electrode is changed.

The invention provides a method for controlling a source of liquid metal ions, the source comprises a tip a first electrode and a second electrode, the method includes the steps of: (i) maintaining the first electrode at a first voltage level range and maintaining the second voltage at a second voltage range, such as to extract metal ions formed on a tip of the source, during an active mode of operation of the source; and (ii) maintaining the first electrode at a third voltage level range and maintaining the second voltage at a fourth voltage level range, such as to substantially reduce an extraction of metal ions from the tip, during an idle mode of operation of the source. The third voltage level range and, alternatively or additionally, the fourth voltage level ranges does not include zero voltage level. The first voltage level range differs than the third voltage level range.

The invention provide a metal liquid ion source that includes a tip, a first electrode, a second electrode and a controller, coupled at least one voltage supply, for maintaining the first electrode at a first voltage level range and maintaining the second voltage at a second voltage range, such as to extract metal ions formed on a tip of the source, during an active mode of operation of the source; and for maintaining the first electrode at a third voltage level range and maintaining the second voltage at a fourth voltage level range, such as to substantially reduce an extraction of metal ions from the tip, during an idle mode of operation of the source. At least one out of the third and fourth voltage level ranges does not include zero voltage level, and the first voltage level range differs than the third voltage level range.

According to an embodiment of the invention the first electrode may be an extraction electrode or a suppression electrode.

According to an embodiment of the invention the third voltage level range may include voltage levels that are lower than a non-extraction voltage level by a first voltage difference.

According to various embodiments of the invention some of the voltage level ranges differ from each other. For example, an upper end of the first voltage level range is higher than an upper end of the third voltage level range and/or an upper end of the fourth voltage level range is higher than an upper end of the second voltage level range.

According to an embodiment of the invention a transition between the idle mode and the active mode does not substantially alter ion-optical properties of an ion-optic components positioned downstream of the source.

According to an embodiment of the invention the transition between the idle mode and the active mode is fast. It can be faster than a minute or even faster than few seconds.

According to an embodiment of the invention during idle mode ions being provided to the tip are maintained in a liquid form.

According to an embodiment of the invention a transition between the idle mode and the active mode is followed by step of stabilizing ion extraction from the tip. The stabilization step may include measuring a flow of extracted ions from the tip and altering a voltage level of a voltage being supplied to one or more electrode.

According to an embodiment of the invention the transition between idle mode and active mode does not involve re-heating the source.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE DRAWINGS

Figure 1:
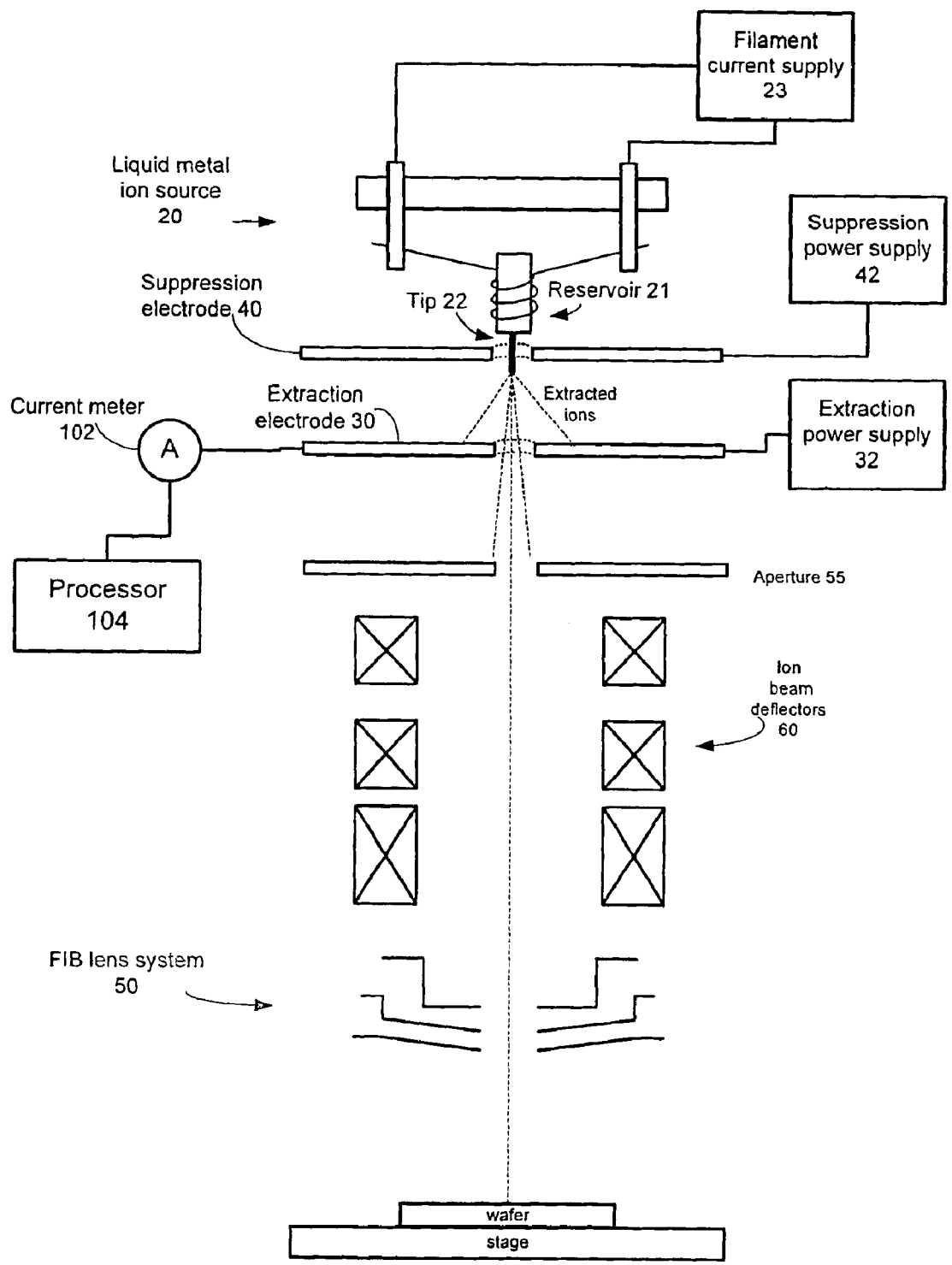
FIG. 1 is a schematic description of a FIB system, according to an embodiment of the invention.

FIB system 10 is described at FIG. 1. FIB system 10 includes: (i) an ion source such as liquid metal ion source 20, for generating an ion beam; (ii) multiple electrodes such as extraction electrode 30 for extracting ions from the source 20, and a suppression electrode 40 that adjusts the strength of the focused electric filed at the tip of the source 20 such as to a desired ion beam current is emitted from the source; (iii) multiple power supply units, such as extractor power supply 32 and suppressor power supply 42 for providing voltages to various components of the FIB system 10, such as extraction electrode 30 and suppression electrode 40, respectively; (iv) ion-optics components such as FIB lens system 50 and ion beam deflector 60. FIB lens system 50 is capable of focusing the ion beam in order to provide a focused ion beam. Ion beam deflector 60 is capable of deflecting the focused ion beam. Usually, a FIB system may also includes an ion beam blanker as well as one or more detectors, apertures and the like.

The liquid metal ion source 20 includes a reservoir 21 that maintains the liquid metal, a tip 22 that is heated by a filament current that is provided by a filament current supply 23. Tip 22 and alternatively reservoir 21 are also heated. The metal is maintained in a liquid form. The reservoir and the tip are arranged such as to form a thin film of liquid metal on the tip 22. Electrical fields induced by electrodes such as 30 and 40 extract ions from the apex of tip 22.

FIB system 10 also includes a current meter 102 electrically connected to the extraction electrode 30 in order to provide an estimation of the current of extracted ions from tip 22 to processor 104. It is noted that the current meter can be electrically coupled to another power supply or part of system 10. Processor 104 is electrically connected to current meter 102 and is capable of controlling the source 20.

Figure 2:
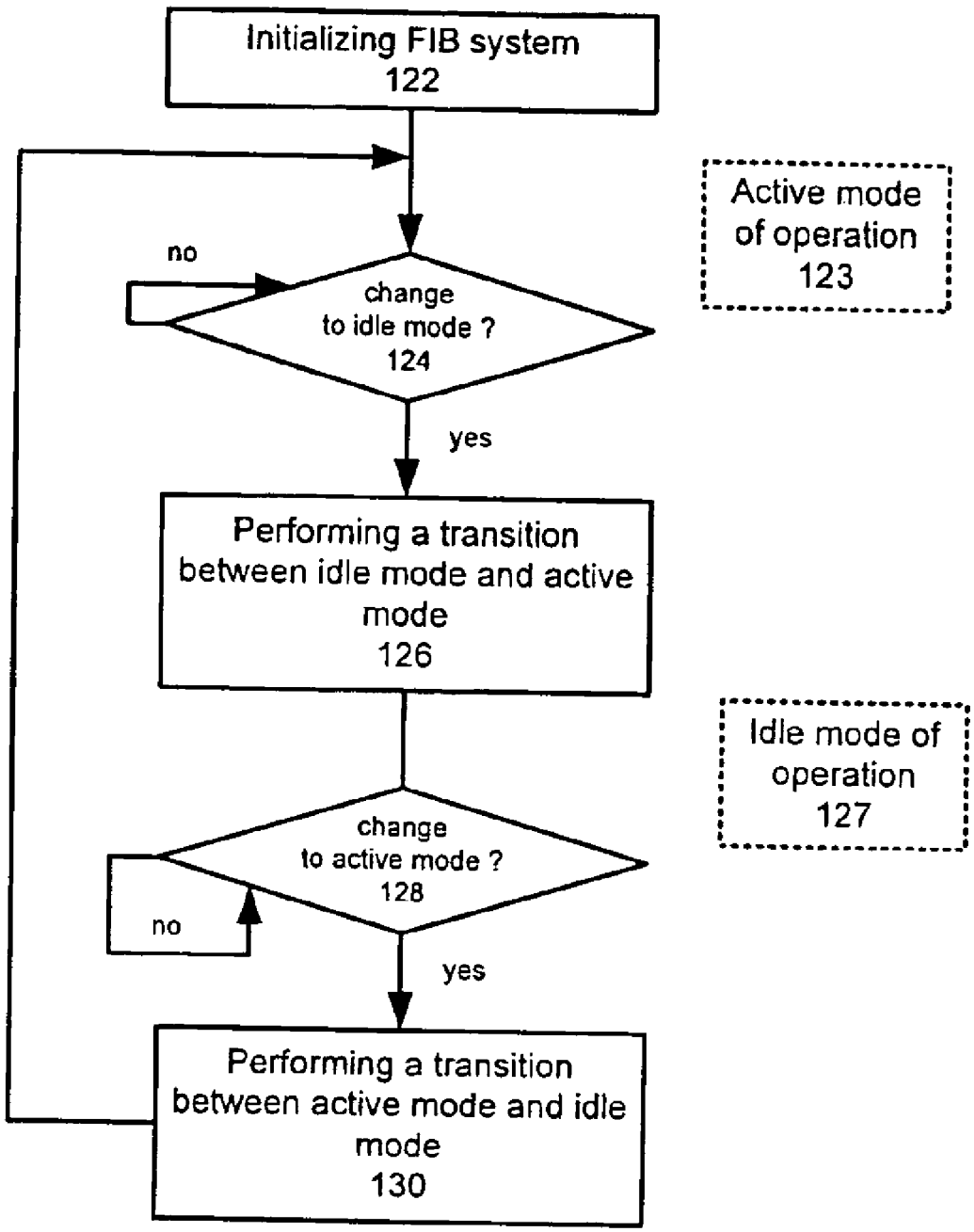
FIG. 2 is a flow chart illustrating a method for controlling a source of liquid metal ions.

FIG. 2 illustrated method 120 for controlling a source of liquid metal ions. Method 120 starts by step 122 of initializing the FIB system. Step 122 may include heating source 22, stabilizing the emission of ions from source 20, calibrating the ion-optics, and the like. The calibration can include aberration reduction and ion-optics alignment.

It is assumed, for simplicity of explanation, that at the end of step 122 source 20 is at an active mode of operation (as illustrated by box 123 positioned between step 122 and step 124). Accordingly, ions are extracted to form a focused ion beam that in turn may be used for various purposes such as milling an object or generating a FIB image.

Step 122 is followed by step 124 of detecting a need to change a mode of operation to idle mode. The detection may be based upon a request from the FIB system operator but can also be generated as a response of the status of the FIB system. For example if the source was not used to mill or generate FIB images during a certain time period than a mode transaction may be required.

Step 124 is followed by step 126 of performing a transition between active mode and idle mode. Step 126 may include pre-transient steps such as deactivating automatic source stabilization processes and saving the extraction electrode voltage level. These pre-transient measures are followed by lowering the extractor electrode voltage level. Conveniently, the extractor electrode voltage level is lowered to a level that is below a non-extracting ion level by a first voltage difference. The inventors used a FIB system in which the non-extracting ion level was about 6500 and lowered the voltage level to 6300 volts.

At the end of step 126 the system is at an idle mode of operation, as illustrated by box 127 positioned between step 126 and step 128.

Step 126 is followed by step 128 of detecting a need to change a mode of operation to an active mode.

Step 128 is followed by step 130 of performing a transition to active mode. Said transition includes increasing the extraction electrode voltage to the level that was saved in step 128. Step 130 may also include post transition steps such as altering the suppression electrode voltage level such as to provide a stable flow of extracted ions at a predefined current level. The inventors stabilized the source at a 2 micro-Ampere level. The post transition steps may also include varying the extraction electrode voltage levels, to prevent the suppression voltage supply from reaching its upper or lower voltage limits.

Step 130 is followed by step 124.

Once a source is maintained at an active mode for prolonged time periods the suppressor voltages must be gradually increased to provide the same current level. This increment is limited by the capabilities of the power supply connected to the suppression electrode. Once this occurs the FIB system has to be shut down and a high current consuming heating process is initiated. This substantially shortens the life span of the source. It is noted that said change of suppression electrode voltage levels may be replaced by a change in the extractor voltages or may be accompanied by said change.

The inventor found out that the transition between idle mode and active mode also provides better extractor voltage/emitted current levels ratio. The transition substantially resets the extractor voltage level increment, thus eliminating the current waist associated with the heating process.

Figure 3:
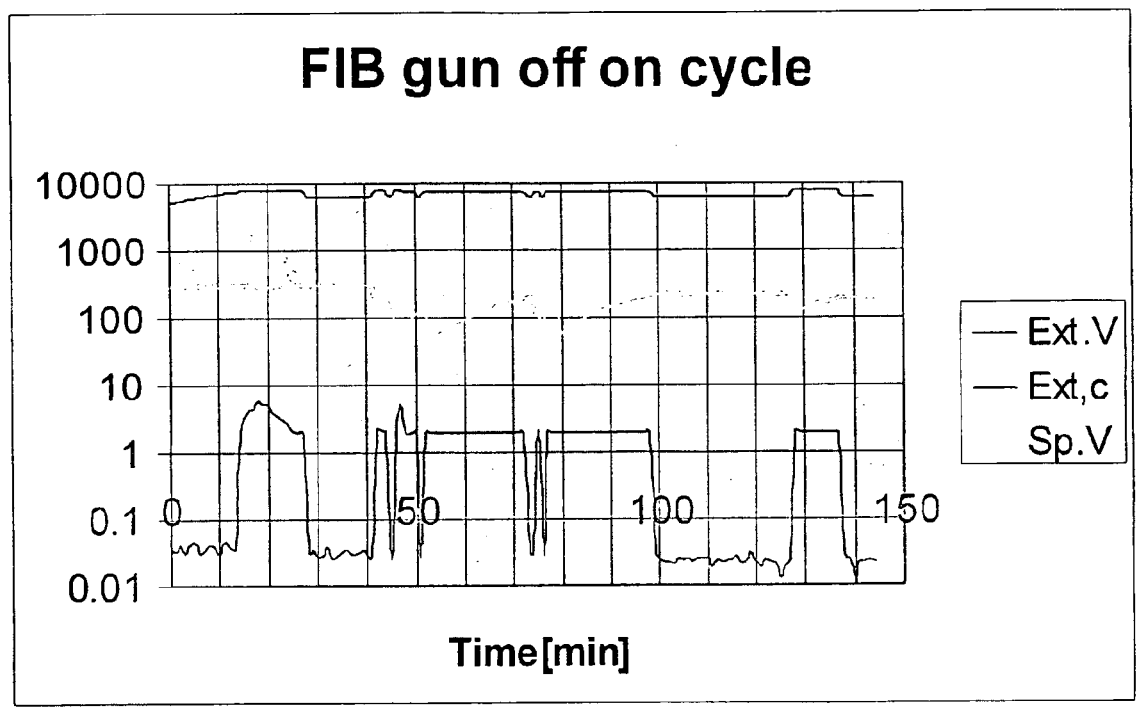
FIG. 3 illustrates various voltage levels during an exemplary sequence of transitions between an active mode of operation and an idle mode of operation, according to an aspect of the invention.

FIG. 3 illustrates three curves representative of extracted current during various modes of operation (lowest curve denoted "Ext. c"), extraction electrode voltage levels (upper curve, denoted "Ext. v") and suppression electrode voltage levels (intermediate curve, denoted "Sp. v"). The upper curve illustrates that during active mode periods the extraction electrode voltage levels are within a first range that includes voltage levels that are higher than voltage levels included within a third range of voltage levels provided during idle mode. The intermediate curve illustrates that during active mode periods the suppression electrode voltage levels are within a second range that includes voltage levels that are higher than voltage levels included within a fourth range of voltage levels provided during idle mode.

It will be apparent to those skilled in the art that the disclosed subject matter may be modified in numerous ways and-may assume many embodiments other then the referred form specifically set out and described above.

Accordingly, the above disclosed subject matter is to be considered illustrative and not restrictive, and to the maximum extent allowed by law, it is intended by the appended claims to cover all such modifications and other embodiments, which fall within the true spirit and scope of the present invention.

The scope of the invention is to be determined by the broadest permissible interpretation of the following claims and their equivalents rather then the foregoing detailed description.

What is claimed is:

1. A method for controlling a source of liquid metal ions, the source comprises a tip a first electrode and a second electrode, the method comprising the steps of:
    maintaining the first electrode at a first voltage level range and maintaining the second electrode at a second voltage range, such as to extract metal ions formed on a tip of the source, during an active mode of operation of the source; and
    maintaining the first electrode at a third voltage level range and maintaining the second electrode at a fourth voltage level range, such as to substantially reduce an extraction of metal ions from the tip, during an idle mode of operation of the source;
    whereas at least one out of the third and fourth voltage level ranges does not include zero voltage level; and
    whereas the first voltage level range differs than the third voltage level range.

2. The method of claim 1 whereas the first electrode is an extraction electrode.

3. The method of claim 1 wherein an upper end of the first voltage level range is higher than an upper end of the third voltage level range.

4. The method of claim 1 wherein the third voltage level range comprises voltage levels that are lower than a non-extraction voltage level by a first voltage difference.

5. The method of claim 1 wherein an upper end of the fourth voltage level range is higher than an upper end of the second voltage level range.

6. The method of claim 1 wherein a transition between the idle mode and the active mode does not substantially alter ion-optical properties of an ion-optic components positioned downstream of the source.

7. The method of claim 1 wherein a transition between the idle mode and the active mode is fast.

8. The method of claim 7 wherein a transition between the idle mode and the active mode does not substantially alter ion-optical properties of an ion-optic components positioned downstream of the source.

9. The method of claim 7 wherein the transition is faster than a minute.

10. The method of claim 1 wherein a transition between the active mode and the idle mode is fast.

11. The method of claim 1 whereas the first electrode is a suppression electrode.

12. The method of claim 1 wherein during the idle mode there is no emission of ions from the tip.

13. The method of claim 1 wherein during idle mode ions being provided to the tip are maintained in a liquid form.

14. The method of claim 1 wherein a transition between the idle mode and the active mode is followed by step of stabilizing ion extraction from the tip.

15. The method of claim 13 wherein the stabilization step comprises measuring a flow of extracted ions from the tip and altering a voltage level of a voltage being supplied to one or more electrode.

16. The method of claim 1 wherein a transition between idle mode and active mode does not involve heating the source.

17. A source of liquid metal ions, comprising:
    a tip;
    a first electrode and a second electrode;
    a controller, coupled at least one voltage supply, for maintaining the first electrode at a first voltage level range and maintaining the second electrode at a second voltage range, such as to extract metal ions formed on a tip of the source, during an active mode of operation of the source; and for maintaining the first electrode at a third voltage level range and maintaining the second electrode a fourth voltage level range, such as to substantially reduce an extraction of metal ions from the tip, during an idle mode of operation of the source;
    whereas at least one out of the third and fourth voltage level ranges does not include zero voltage level; and
    whereas the first voltage level range differs than the third voltage level range.

18. The source of claim 17 whereas the first electrode is an extraction electrode.

19. The source of claim 18 wherein an upper end of the first voltage level range is higher than an upper end of the third voltage level range.

20. The source of claim 18 wherein the third voltage level range comprises voltage levels that are lower than non-extraction voltage level by a first voltage difference.

21. The source of claim 18 wherein an upper end of the fourth voltage level range is higher than an upper end of the second voltage level range.

22. The source of claim 18 wherein a transition between the idle mode and the active mode does not substantially alter ion-optical properties of an ion-optic components positioned downstream of the source.

23. The source of claim 18 wherein a transition between the idle mode and the active mode is fast.

24. The source of claim 17 wherein a transition between the idle mode and the active mode does not substantially alter ion-optical properties of an ion-optic components positioned downstream of the source.

25. The source of claim 24 wherein the transition is faster than a minute.

26. The source of claim 17 wherein a transition between the active mode and the idle mode is fast.

27. The source of claim 17 whereas the first electrode is a suppression electrode.

28. The source of claim 17 wherein during the idle mode there is no emission of ions from the tip.

29. The source of claim 17 wherein during idle mode ions being provided to the tip are maintained in a liquid form.

30. The source of claim 17 wherein the controller is capable of initiating a stabilization process after a transition between the idle mode and the active mode.

31. The source of claim 30 wherein the stabilization process comprises measuring a flow of extracted ions from the tip and altering a voltage level of a voltage being supplied to one or more electrode.

32. The source of claim 30 wherein a transition between idle mode and active mode does not involve heating the source.

* * * * *